United States Patent [19]

Inoue

[11] Patent Number: 4,810,342

[45] Date of Patent: Mar. 7, 1989

[54] METHOD FOR CONTROLLING SUBSTRATE TEMPERATURE IN A HIGH TEMPERATURE SPUTTERING PROCESS

[75] Inventor: Minoru Inoue, Kawasaki, Japan

[73] Assignee: Fujitsu Limited, Kawasaki, Japan

[21] Appl. No.: 210,424

[22] Filed: Jun. 23, 1988

[30] Foreign Application Priority Data

Jul. 2, 1987 [JP] Japan ................. 62-165798

[51] Int. Cl.$^4$ .................. C23C 14/16; C23C 14/54
[52] U.S. Cl. .................. 204/192.17; 204/192.1; 204/192.13; 204/192.15; 204/298
[58] Field of Search .............. 204/192.15, 192.13, 204/298 ET, 192.17, 298 EG, 298 GF, 298 EE, 298 MT, 298, 192.1

[56] References Cited

U.S. PATENT DOCUMENTS 4,565,601 1/1986 Kakehi et al. .................. 156/643

OTHER PUBLICATIONS

P. S. McLeod et al., Journal Vac. Sci. Tech., vol. 14, No. 1, pp. 263–265, Jan./Feb. 1977.

Primary Examiner—G. L. Kaplan
Assistant Examiner—David G. Ryser
Attorney, Agent, or Firm—Staas & Halsey

[57] ABSTRACT

This high temperature heating sputtering process comprises the steps of:

providing a semiconductor substrate (10) and a target (5) of a wiring material positioned opposite to the semiconductor substrate (10) in a vacuum chamber (1);

sputtering a heated gas through a first gas supply unit to heat the semiconductor substrate (10) and to cause an electric discharge of the heated gas ions by using an electric discharge, to cause said heated gas ions to collide with a surface of the target (5); and depositing the target material from the surface of the target (5) onto the surface of the semiconductor substrate (10) by a sputtering process, wherein, the amount of heated gas supplied to the vacuum chamber (1) is decreased in accordance with an increase of a temperature of the semiconductor substrate (10), and simultaneously, supplying the same gas from a second gas supply means (4b) into the vacuum chamber (1) in the same amount as the decrease of gas from the first gas supply means so that the temperature of the semiconductor substrate is maintained at a constant value and the inner pressure of the vacuum chamber (1) is also maintained at a constant value.

8 Claims, 2 Drawing Sheets

METHOD FOR CONTROLLING SUBSTRATE TEMPERATURE IN A HIGH TEMPERATURE SPUTTERING PROCESS

BACKGROUND OF THE INVENTION

1. Field of the Invention

The present invention relates to a high temperature heating sputtering process, more particularly, it relates to a high temperature heating sputtering process which provides a sputter-deposited metal film having improved properties.

2. Description of the Related Art

In general, the metal wiring material of a semiconductor device, is made of, for example, an aluminum and an aluminum alloy, e.g., an aluminum alloy containing about 1 to 2% silicon.

Recent development in the degree of integration and high density of semiconductor device elements have resulted in an even greater miniaturization of such elements, and thus the aspect ratio, i.e., the ratio of depth to width of a contact hole formed in the substrate, has become greater. The contact hole forms a step in a metal wiring region of a semiconductor device, and due to this increase of the aspect ratio, the step coverage of a contact hole has become difficult.

In general, a sputtering process is used to deposit an aluminum and an aluminum alloy, sputtered from a target thereof, onto a substrate as a metal wiring material, and to improve the step coverage, a high temperature heating sputtering process has been developed wherein sputtering is carried out while a substrate, e.g., a silicon wafer is kept at a high temperature of, for example, 500° to 600° C. In this high temperature heating sputtering process, the substrate is heated to a temperature close to a melting point of the deposited metal, for example, 400° to 500° C. in a case of an aluminum, the aluminum is sputtered and deposited on the substrate, and the deposited aluminum is moved on the wafer so that a greater amount of metal is deposited in a contact hole, to thus improve the step coverage.

In the high temperature heating sputtering process, the temperature of the substrate, for example, a silicon wafer, must be efficiently carried out, and therefore, a gas-assisted type sputtering device has been developed.

FIG. 1 is a schematic view of a conventional gas-assisted type sputtering device.

In a conventional high temperature heating sputtering process using the gas-assisted type sputtering device shown in FIG. 1, a substrate 10, for example, a silicon wafer, is arranged on a substrate holder 9 having a substrate supporter 17, in a vacuum chamber 1 having an exhaust gas control valve 8. Argon (Ar) gas for heating the substrate 10 is supplied through a gas supply means 4 having gas flow rate controller 7a and a needle valve 7b, while controlling the temperature of the substrate 10 by a heater controller 11 connected to a cartridge heater 3, and the argon gas is ionized by an electric discharge means 6 connected to a D.C. power source 14, so that the ions collide with a target 5 and the target material, for example, aluminum, is sputtered and deposited on the substrate 10. In FIG. 1, the numbers 12, 13, 15, and 16, denote a target fixing holder, a target supporting cooling plate, a permanent magnet, and a rotating part, respectively.

The gas-assisted type heating method in a sputtering shown in FIG. 1 is superior to the well known infrared-ray heating method in a sputtering. Namely, in this infrared process, the heating effects, i.e., the infrared ray absorption ratios, are different due to, for example, a specific resistance of the wafer and kinds of deposits thereon, and thus a control of the temperature is difficult. Such problems do not arise in the gas-assisted type sputtering process.

Nevertheless, in the high temperature sputtering process using the gas-assisted type sputtering device, the temperature of the wafer may be often varied by the kinetic energy of a sputtered target material which is deposited on a wafer, and by the kinetic energy of a secondary electron emitted from the surface of the target. Namely, the results of an experiment showed that the temperature of a wafer is increased by 100° to 150° C. during the sputtering process, compared with the temperature at the start of the sputtering process, as shown in FIG. 2. This increase of the temperature causes variations in the properties of the deposited material film, for example, the surface of the film is undulated or becomes white and cloudy, and the deposited film is not homogeneous in the direction of the film thickness.

Accordingly, to control the temperature of the substrate on which a target material is deposited, the temperature of the heater block 2 must be controlled, but the control response time is slow, and therefore, in the gas-assisted type sputtering device shown in FIG. 1, the amount of gas supplied is varied to improve the control response time. Nevertheless, to make an abrupt change in the temperature, the amount of gas supplied must be extremely varied, with the result that the inner pressure of the vacuum chamber is varied and thus the sputtering condition is varied.

SUMMARY OF THE INVENTION

An object of the present invention is to provide a high temperature heating sputtering process wherein a temperature of a wafer is maintained within a required range so that the properties of the deposited film are improved.

According to the present invention, there is provided a high temperature heating sputtering process comprising the steps of:

providing a semiconductor substrate (10) and a target (5) of a wiring material positioned opposite to the semiconductor substrate (10) in a vacuum chamber (1);

supplying a heated gas through a first gas supply means (4a) to heat the semiconductor substrate (10) and to cause an electric discharge of heated gas ions by using an electric discharge, to cause said heated gas ions to collide with a surface of the target (5);

depositing the target material from the surface of the target (5) onto the surface of the semiconductor substrate (10) by a sputtering process wherein, an amount of heated gas supplied to the vacuum chamber (1) is decreased in accordance with an increase of the temperature of the semiconductor substrate (10), and simultaneously, supplying the same gas from a second gas supply means (4b) into the vacuum chamber (1) in the same amount as the decrease of gas from the first gas supply means so that the temperature of the semiconductor substrate is maintained at a constant value and the inner pressure of the vacuum chamber (1) is also maintained at a constant value.

DESCRIPTION OF THE PREFERRED EMBODIMENT

The preferred embodiment of the present invention will now be described with reference to the drawings.

Figure 1:
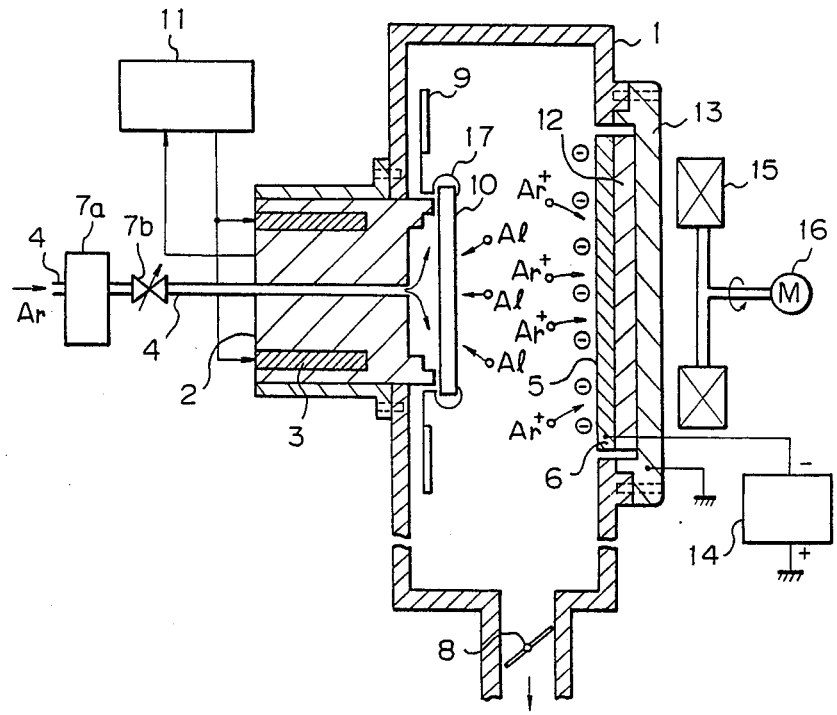
FIG. 1 is a schematic view of a conventional gas-assisted type sputtering device.
Figure 2:
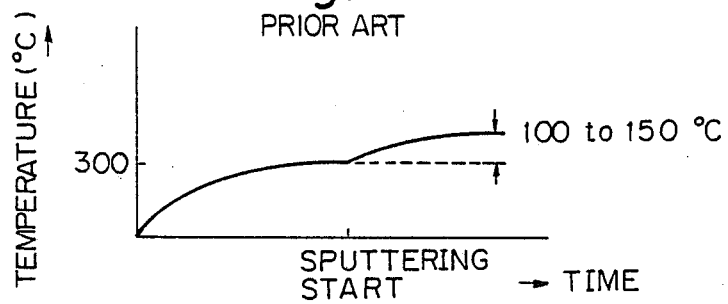
FIG. 2 is a graph illustrating the problems of a conventional gas-assisted sputtering device; and, FIG. 3 shows a gas-assisted type sputtering device by which the high temperature sputtering process according to the present invention is carried out, as an example.
Figure 3:
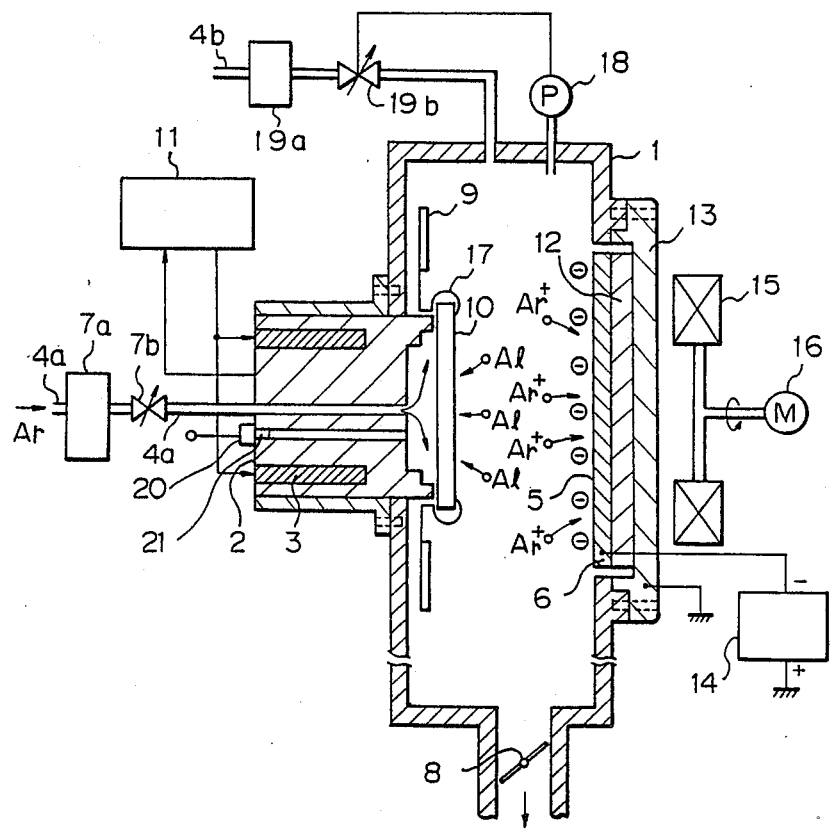

FIG. 3 shows a gas-assisted type sputtering device by which high temperature sputtering process according to the present invention is carried out, as an example.

As shown in FIG. 3, in the device according to the present invention, an infrared ray thermometer 20, a transparent window 21, a second gas supply means 4b having a mass flow controller 19a and a needle valve 19b, and an ionization vacuum indicator 18, are provided in addition to the elements provided in a conventional device.

The second gas supply means 4b feeds the same gas, for example, Ar, into the vacuum chamber 1; the quantity of gas being controlled by the mass flow controller 19a. The ionization vacuum indicator 18 is a pressure detector which detects an inner pressure of the vacuum chamber 1.

A substrate 10, e.g., a silicon wafer, is provided on a substrate holder 9 and supported thereon by a substrate supporter 17. An argon (Ar) gas is fed by a first gas supply means 4a into a hole of a block heater 2 heated to a temperature of about 600° C. by a cartridge heater 3, and thus the substrate 10 is heated to a temperature of about 465° C. by the heated Ar gas. Note, when Ar gas is not supplied, the substrate is heated only to 380° C. After heating the substrate to about 465° C., the Ar gas is ionized by an electric discharge means 6, while controlling the temperature of the substrate 10. The ionized Ar ions collide with a target 5 of Al-Si (1 wt %) alloy so that the target material (Al-Si) is sputtered and deposited onto the substrate 10.

When a deposited film having a thickness of 1μ has been deposited on the substrate for a time of 75 seconds, since sputtered particles of Al and Si having a kinetic energy collide with the surface of the substrate 10, the temperature of the substrate 10 is increased by about 70° C., and this increase is detected by the infrared thermometer 20. Therefore, up to the point at which the deposition of the target material on the substrate is started, 17.5 SCCM Ar gas is fed into the vacuum chamber 1 through the heater block 2 and then the Ar gas flow rate is decreased at a rate of 17.5/75 (SCCM/sec). Simultaneously, at the other gas supply system, for example, the second gas supply means 4b, the Ar gas flow rate is increased at a rate of 17.5/75 (SCCM/sec), so that the degree of vacuum is maintained at 5 mm Torr, which pressure is detected by the electric discharge vacuum indicator 18. Accordingly, the change of the temperature of the substrate, e.g., a silicon wafer, can be kept within ±10° C. of the desired range, and thus an aluminum film having homogeneous properties in the direction of the film thickness can be obtained.

I claim:

1. A high temperature heating sputtering process comprising the steps of:

providing a semiconductor substrate (10) and a target (5) of wiring material positioned opposite to the semiconductor substrate (10) in a vacuum chamber (1);

supplying a heated gas through a first gas supply means (4a) to heat the semiconductor substrate (10) and causing an electric discharge of the heated gas ions by using an electric discharge means to cause said heated gas ions to collide with a surface of the target (5);

and depositing the target material from the surface of the target (5) onto a surface of the semiconductor substrate (10) by a sputtering process, wherein, the amount of heated gas supplied to the vacuum chamber (1) is decreased in accordance with an increase of a temperature of the semiconductor substrate (10), and simultaneously, supplying the same gas from a second gas supply means (4b) into the vacuum chamber (1) in the same amount as the decrease of gas from the first gas supply means (1) so that the temperature of the semiconductor substrate is maintained at a constant value and the inner pressure of the vacuum chamber (1) is also maintained at a constant value.

2. A process according to claim 1, wherein said substrate (10) is a silicon wafer.

3. A process according to claim 1, wherein said target material is one of an aluminum and aluminum alloy.

4. A process according to claim 1, wherein said gas supplied through said first gas supply means (4a) is an argon gas.

5. A process according to claim 1, wherein said gas supplied through said second gas supply means (4b) is an argon gas.

6. A process according to claim 1, wherein a temperature of said substrate (10) is detected by an infrared ray (I.R.) thermometer.

7. A process according to claim 1, wherein an inner pressure of said vacuum chamber is detected by an electric discharge vacuum indicator (18).

8. A process according to claim 1, wherein a flow rate of the gas supplied through said first gas supply means (4a) is decreased to 17.5/75 (SCCM/sec), and simultaneously, the flow rate of the gas supplied through said second gas supply means (4b) is increased by 17.5/75 (SCCM/sec).

* * * * *

UNITED STATES PATENT AND TRADEMARK OFFICE
CERTIFICATE OF CORRECTION

PATENT NO. : 4,810,342

DATED : March 7, 1989

INVENTOR(S) : MINORU INOUE

It is certified that error appears in the above-identified patent and that said Letters Patent is hereby corrected as shown below:

Front Page [57] Abstract, line 18, delete

"a temperature" and insert --the temperature--.

Column 4, line 27, delete "a" and insert --the--.

Signed and Sealed this

Twenty-second Day of August, 1989

Attest:

DONALD J. QUIGG

Attesting Officer

Commissioner of Patents and Trademarks